US011978526B2

(12) United States Patent
Liu et al.

(10) Patent No.: US 11,978,526 B2
(45) Date of Patent: May 7, 2024

(54) DATA PROCESSING CIRCUIT AND FAULT MITIGATING METHOD

(71) Applicant: Skymizer Taiwan Inc., Taipei (TW)

(72) Inventors: Shu-Ming Liu, Taipei (TW);
Kai-Chiang Wu, Hsinchu (TW);
Chien-Fa Chen, Taipei (TW); Wen Li Tang, Taipei (TW)

(73) Assignee: Skymizer Taiwan Inc., Taipei (TW)

( * ) Notice: Subject to any disclaimer, the term of this patent is extended or adjusted under 35 U.S.C. 154(b) by 130 days.

(21) Appl. No.: 17/705,415

(22) Filed: Mar. 28, 2022

(65) Prior Publication Data

US 2023/0077991 A1    Mar. 16, 2023

(30) Foreign Application Priority Data

Sep. 10, 2021    (TW) ................................ 110133813

(51) Int. Cl.
| | |
|---|---|
| *G11C 29/44* | (2006.01) |
| *G11C 11/54* | (2006.01) |
| *G11C 29/00* | (2006.01) |
| *G11C 29/42* | (2006.01) |

(52) U.S. Cl.
CPC .......... *G11C 29/4401* (2013.01); *G11C 11/54* (2013.01); *G11C 29/42* (2013.01); *G11C 29/702* (2013.01)

(58) Field of Classification Search
CPC ... G11C 29/702; G11C 29/4401; G11C 29/76; G11C 11/54; G11C 29/42; G06N 3/0455; G06N 3/0464; G06N 3/06
See application file for complete search history.

(56) References Cited

U.S. PATENT DOCUMENTS

| | | | |
|---|---|---|---|
| 9,653,183 B1 | 5/2017 | Shin et al. | |
| 2006/0107127 A1* | 5/2006 | Park | G06F 11/1048 |
| | | | 714/704 |
| 2017/0184662 A1* | 6/2017 | Varadarajan | G11C 29/44 |
| 2018/0358108 A1* | 12/2018 | Kim | G11C 29/72 |

(Continued)

FOREIGN PATENT DOCUMENTS

| | | |
|---|---|---|
| CN | 110390993 | 10/2019 |
| TW | 201110132 | 3/2011 |

(Continued)

OTHER PUBLICATIONS

"Notice of Allowance of Taiwan Counterpart Application", dated Nov. 30, 2022, p. 1-p. 5.

*Primary Examiner* — Tuan T Nguyen
(74) *Attorney, Agent, or Firm* — JCIPRNET (57) ABSTRACT

A data processing circuit and a fault mitigating method are provided. The method is adapted for a memory having at least one fault bit. The memory provides a block for data storage. A difference between an output of a value of a plurality of bits input to at least one computing layer in a neural network and a correct value is determined. The bits are respectively considered the at least one fault bit. A repair condition is determined based on the difference. The repair condition includes a correspondence between a position where the fault bit is located in the block and at least one non-fault bit in the memory. A value of at least one non-fault bit of the memory replaces a value of the fault bit based on the repair condition.

10 Claims, 6 Drawing Sheets

(56) References Cited

U.S. PATENT DOCUMENTS

2020/0312420 A1* 10/2020 Haywood ........ G11C 29/12015
2020/0321070 A1* 10/2020 Hanagandi ......... G11C 29/1201

FOREIGN PATENT DOCUMENTS

| TW | I441189 | 6/2014 |
| TW | I544413 B | 8/2016 |
| TW | 201933372 | 8/2019 |
| TW | 202025167 | 7/2020 |
| TW | 722797 | 3/2021 |

* cited by examiner

| B0_7 | B0_6 | B0_5 | B0_4 | B0_3 | B0_2 | B0_1 | B0_0 |
|------|------|------|------|------|------|------|------|
| B1_7 | B1_6 | B1_5 | B1_4 | B1_3 | B1_2 | B1_1 | B1_0 |
| B2_7 | B2_6 | B2_5 | B2_4 | B2_3 | B2_2 | B2_1 | B2_0 |
| B3_7 | B3_6 | B3_5 | B3_4 | B3_3 | B3_2 | B3_1 | B3_0 |

FIG. 8A

| B0_3 | B0_2 | B0_1 | X | B0_7 | B0_6 | B0_5 | B0_4 |
|------|------|------|---|------|------|------|------|
| B1_3 | B1_2 | B1_1 | X | B1_7 | B1_6 | B1_5 | B1_4 |
| B2_3 | B2_2 | B2_1 | X | B2_7 | B2_6 | B2_5 | B2_4 |
| B3_3 | B3_2 | B3_1 | X | B3_7 | B3_6 | B3_5 | B3_4 |

FIG. 8B

| B0_7 | B0_6 | B0_5 | B0_4 | B0_3 | B0_2 | B0_1 | X |
|------|------|------|------|------|------|------|---|
| B1_7 | B1_6 | B1_5 | B1_4 | B1_3 | B1_2 | B1_1 | X |
| B2_7 | B2_6 | B2_5 | B2_4 | B2_3 | B2_2 | B2_1 | X |
| B3_7 | B3_6 | B3_5 | B3_4 | B3_3 | B3_2 | B3_1 | X |

FIG. 8C

DATA PROCESSING CIRCUIT AND FAULT MITIGATING METHOD

CROSS-REFERENCE TO RELATED APPLICATION

This application claims the priority benefit of Taiwan application serial no. 110133813, filed on Sep. 10, 2021. The entirety of the above-mentioned patent application is hereby incorporated by reference herein and made a part of this specification.

BACKGROUND

Technical Field

The disclosure relates to a data processing mechanism, particularly to a data processing circuit and a fault mitigating method.

Description of Related Art

Neural networks is an important subject in the field of Artificial Intelligence (AI) that makes decisions by simulating the operation of human brain cells in which neurons are connected to each other through synapses. Each neuron receives a signal through a synapse, and the signal is then transformed into outputs to be transmitted to another neuron. Each neuron has different transformation ability. It is through the operation of the signal transmission and transformation that the ability for human beings to think and decide is developed. And it is also based on such operation that the neural network develops the corresponding ability.

Neural networks are often employed in image recognition. In the operation of each neuron, the input component is multiplied by the weight of the corresponding synapse (possibly with a bias) and then output by a nonlinear function (for example, an activation function), from which the image characteristics are captured. It is possible that the memory for storing inputs, weights, and function parameters has poor yield that causes some storage blocks to have fault/damage (for example, hard errors) affecting the completeness or accuracy of the stored data. Even when convolutions are performed in convolutional neural networks (CNN), the fault/damage may still affect the result of image recognition seriously. For example, if the fault occurs in a higher bit, the success rate for image recognition may be next to zero.

SUMMARY

In view of this, the embodiments of the present disclosure provide a data processing circuit and a fault mitigating method that customize a repair mechanism to mitigate the fault/damage of a memory encountered by different types of neural network models.

The fault mitigating method of the embodiment of the present disclosure is adapted for a memory having at least one fault bit, and the memory provides blocks for data storage. The fault mitigating method includes (but is not limited to) the following steps. The difference between the output of one or more computing layers in a neural network and a corresponding correct value of a value of multiple bits in the block is determined. The bits are respectively considered the fault bit. A repair condition of the memory is determined based on the difference. The repair condition includes a correspondence between the position where the fault bit is located in the block and at least one non-fault bit in the memory. And based on the repair condition, a value of the at least one fault bit is replaced by a value of the at least one non-fault bit in the memory.

The data processing circuit of the embodiment of the present disclosure includes (but is not limited to) a first memory and a processor. The first memory is configured to store a program code. The processor is coupled to the first memory and is configured to load and execute the program code to determine a difference between an output of one or more computing layers in the neural network and a corresponding correct value of a value of multiple bits in the block. The repair condition of the second memory is determined based on the difference. And based on the repair condition, the value of the at least one non-fault bit in the second memory replaces the value of the fault bit. The bits are respectively considered the fault bit. The second memory provides the block for data storage and has at least one fault bit. The repair condition includes a correspondence between the position where the at least one fault bit is located in the block and at least one non-fault bit in the memory.

Based on the above, in the data processing circuit and the fault mitigating method of the embodiments of the present disclosure, the repair condition is determine based on the difference between the fault simulation result and the correct value, and the fault found in a specific bit position is then replaced by a suitable non-fault bit. In this way, the recognition success rate may be improved, and they are suitable for various types of neural network models.

In order to make the above-mentioned features and advantages of the present disclosure more comprehensible, the following embodiments are described in detail in conjunction with the drawings.

DESCRIPTION OF THE EMBODIMENTS

Figure 1:
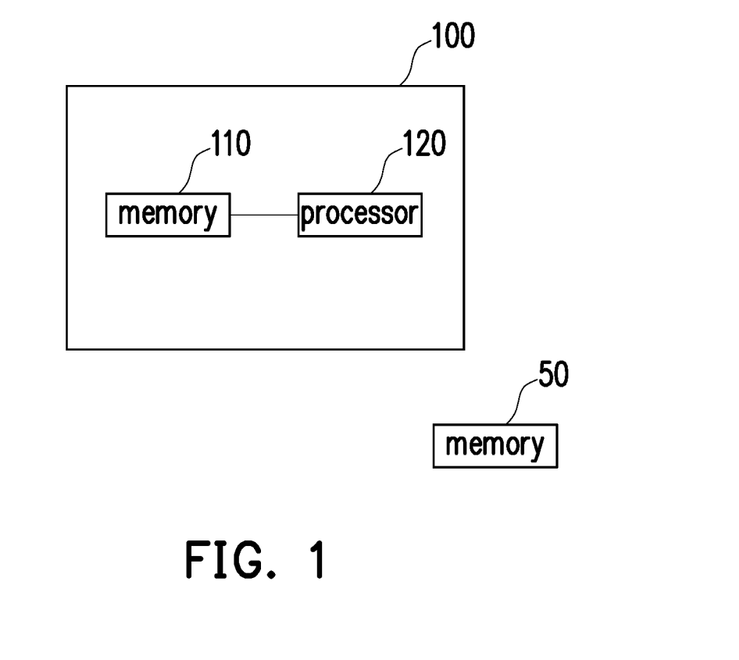
FIG. 1 is a block diagram of components of a data processing circuit according to an embodiment of the present disclosure.

FIG. 1 is a block diagram of components of a data processing circuit 100 according to an embodiment of the present disclosure. In FIG. 1, the data processing circuit 100 includes (but is not limited to) a memory 110 and a processor 120.

The memory 50 and the memory 110 may be static or dynamic random access memory (RAM), read-only memory (ROM), flash memory, register, combinational circuit, or a combination of the above components. In one embodiment, the memory 50 and the memory 110 are adapted to store image-related data, weighting for the multiply accumulate (MAC) operation of feature extraction on the image, and/or numeral values used in activation operation, pooling operation, and/or other neural network operation. In other embodiments, the user may determine the type of data stored in the memory 110 based on actual needs. In one embodiment, the memory 110 is adapted to store program codes, software modules, configurations, data, or files (such as parameters, differences, values, repair conditions), which will be described in detail in the following embodiments.

In one embodiment, the memory 50 has one or more fault bit. The fault bit refers to a fault/damage (which can be called a hard error or permanent fault) caused by process negligence or other factors that makes the access result different from the actual storage content. These fault bits have been detected in advance, and their location information in the memory 50 may be accessed by the processor 120 (via a wired or wireless transmission interface).

In one embodiment, the memory 50 having the fault bits may be located in other external devices or circuits. In another embodiment, the memory 50 having the fault bits may be provided in the data processing circuit 100 or be integrated with the memory 110 as a whole.

The processor 120 is coupled to the memory 110. The processor 120 may be a circuit composed of at least one of multiplexers, adders, multipliers, encoders, decoders, or various types of logic gates, and it may be a central processing unit (CPU), graphics processing unit (GPU), other programmable general-purpose or special-purpose microprocessor, digital signal processor (DSP), programmable controller, field programmable gate array (FPGA), application-specific integrated circuit (ASIC), neural network accelerator, other similar components, or a combination of the above components. In one embodiment, the processor 120 is configured to perform all or part of the operations of the data processing circuit 100, and it can load and execute various software modules, program codes, files, and data stored in the memory 110. In some embodiments, the operation of the processor 120 can be implemented by software.

Components or circuits in the data processing circuit 100 are described hereinafter in the embodiments to illustrate the method of the present disclosure. Each process of the method can be adjusted based on the implementation situation, and thus it is not limited thereto.

Figure 2:
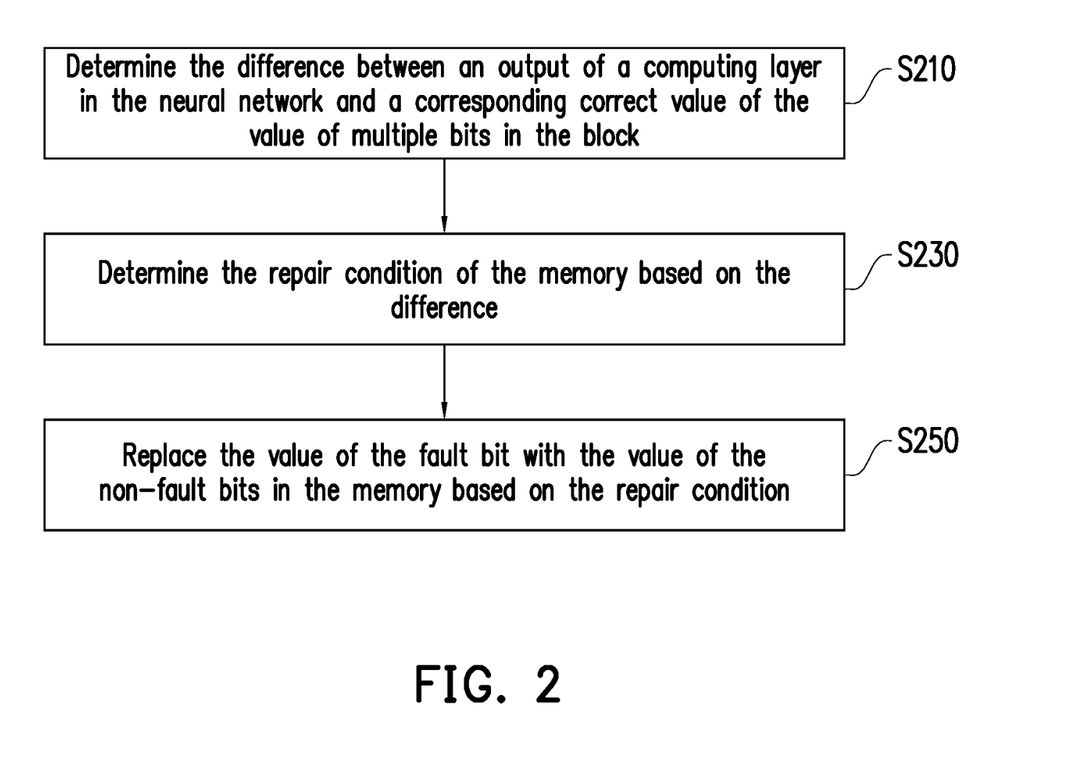
FIG. 2 is a flowchart of a fault mitigating method according to an embodiment of the present disclosure.

FIG. 2 is a flowchart of a fault mitigating method according to an embodiment of the present disclosure. In FIG. 2, the difference between an output of one or more computing layers in the neural network and a corresponding correct value of the value of a plurality of bits in the block may be determined by a processor 120 (step S210). Specifically, the memory 50 having one or more fault bits provides one or more blocks for data storage. This block may be adapted to store the input parameters and/or output parameters of the neural network (for example, feature maps or weights). The version of the neural network may be any one of Inception, GoogleNet, ResNet, AlexNet, SqueezeNet or other models. The neural network may include one or more computing layers. This computing layer may be a convolutional layer, an excitation layer, a pooling layer, or other neural network-related layer.

Figure 3:
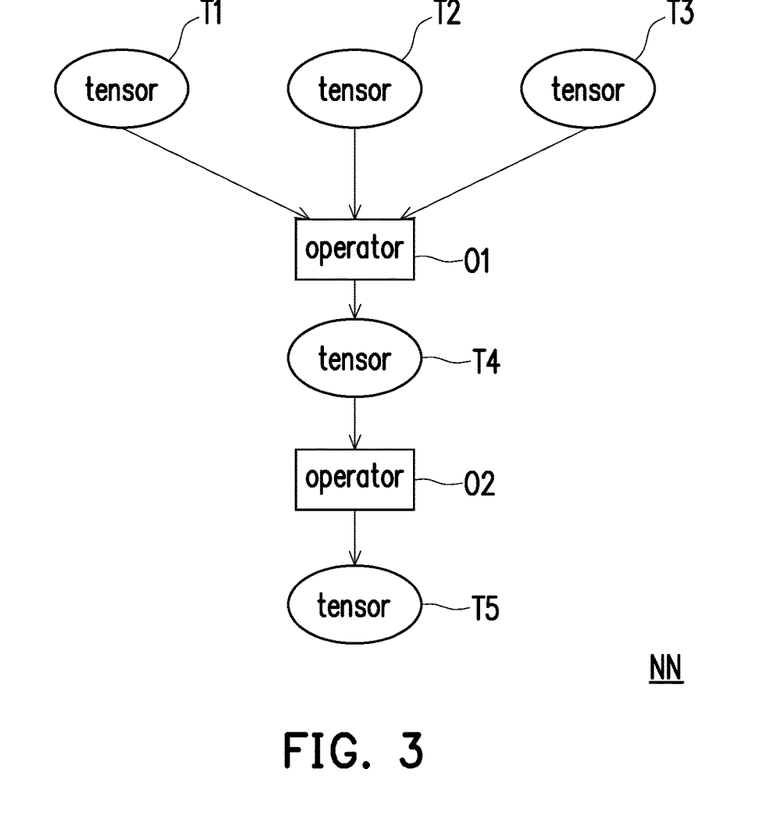
FIG. 3 is a schematic diagram of a neural network architecture according to an embodiment of the disclosure.

For example, FIG. 3 is a schematic diagram of a neural network architecture according to an embodiment of the disclosure. In FIG. 3, this neural network architecture includes two operators, an operator O1 and an operator O2, that respectively correspond to a convolutional layer and an excitation layer (i.e., the computing layer). The operator O1 has three input parameters (i.e., a tensor T1 to a tensor T3, or termed feature map) and one output parameter (i.e., a tensor T4). The operator O2 has one input parameter (i.e., the tensor T4) and one output parameter (i.e., a tensor T5).

If the tensors T1 to T4 are stored in a fault bit, it may affect the final prediction result, identification result, or classification result of the neural network. Note that the processor 120 regards these bits respectively as fault bits. In an embodiment, the processor 120 may perform a simulation in which a specific one, more, or each of these bits in one or more blocks of the memory 50 respectively perform a simulation in which a fault bit. For example, a certain sequence block includes 8 bits and it is adapted to store 8-bit sequential data. The processor 120 may perform a simulation in which the highest bit in this block is the fault bit (for example, the value obtained by reading this bit is all 0 or 1), a simulation in which the second highest bit in this block is the fault bit, and so on. It should be noted that the number of bits in a block is not limited to 8 but may also be 16, 32, or other numbers.

The processor 120 may obtain the output of the block having the simulated fault bit through one or more computing layers. Specifically, the processor 120 may store test data in a block with the simulated fault bits and read the data in this block to input it to the computing layer. For example, the processor 120 performs a simulation in which a specific position of the block has the value read by the fault bit. If there are more computing layers, the output of the previous computing layer may be stored in the same or different blocks, and the processor 120 reads the data of this block again to input it to the next computing layer. The result of the data being processed by one or more computing layers may be taken as the output of the computing layer.

In one embodiment, the processor 120 selects the output from the first to the n-th operational layer, where n is a positive integer. In another embodiment, the processor 120 selects the output from the n-th computing layer to the last computing layer. In another embodiment, the processor 120 selects the output of the n-th computing layer.

In addition, the processor 120 obtains the test data input to the computing layer and processes the correct value obtained by one or more computing layers in the neural network. This correct value is obtained by simulation, and it is assumed that the block stored by the tensor has no fault bits. The difference between the correct value and the output of the computing layer in the case of having a fault bit may be obtained by mean square error (MSE), root-mean-square error (RMSE), least-mean-square error (LMSE), cosine similarity, cosine distance, or other error-related functions.

Take the mean square error as an example. The output of the computing layer in the case of having a fault bit forms a first vector, whereas the correct value forms a second vector. The processor 120 calculates the square value of the difference of each corresponding element in the two vectors, and calculates the average of these square values.

Figure 4:
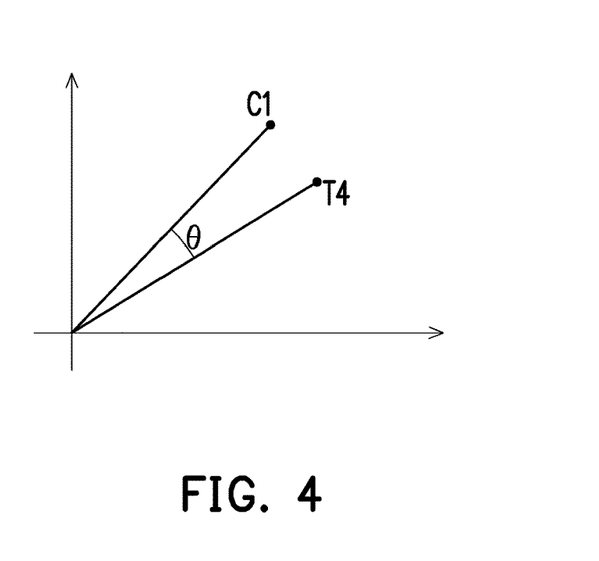
FIG. 4 is a schematic diagram of Cosine Similarity according to an embodiment of the present disclosure.

Take another example. FIG. 4 is a schematic diagram of cosine similarity according to an embodiment of the present disclosure. In FIG. 4, assuming that a vector A of a correct value C1 and a vector B of the tensor T4 of FIG. 3 form an angle θ, the mathematical relation is as follows.

$$\cos(\theta) = \frac{A \cdot B}{\|A\| \times \|B\|} = \frac{\sum_{i=1}^{m} A_i \times B_i}{\sqrt{\sum_{i=1}^{m} A_i^2} \times \sqrt{\sum_{i=1}^{m} B_i^2}} \quad (1)$$

In this mathematical relation, $\cos(\theta)$ is the cosine similarity, $A_i$ is the i-th element in the vector A, $B_i$ is the i-th element in the vector B, and m is the total number of all elements in the vector A and the vector B. And $\cos(\theta)$ being 1 means that the difference is at the smallest, $\cos(\theta)$ being −1 means the difference is at the largest, and $\cos(\theta)$ falling within the range of −1 and 1 means that the difference is between the said minimum difference and said maximum difference.

In FIG. 2, the repair condition of the memory 50 may be determined by the processor 120 based on the difference between the output of the computing layer and the correct value obtained at different positions of the fault bits in the block (step S230). Specifically, according to the experimental results, the accuracy of the prediction result of the neural network may be different if the location of the fault bit in the block is different. For example, if the failure occurs in the higher bit in the block, the recognition success rate is nearly zero. If the fault occurs in the lowest bit in the block, the recognition success rate exceeds 60%. In addition, according to the experimental results, if the value of the non-fault bit is replaced by/acting as/substituted with the value of the fault bit, it helps improve the accuracy of image recognition or the related applications. Therefore, suitable repair strategies may be provided for fault bits in different locations.

In the embodiment of the present disclosure, the repair condition (i.e., the repair strategy) includes the correspondence between the position where one or more fault bits are located in the block and one or more non-fault bits in the memory 50. The non-fault bit means that the bit is not damaged or faulty, and the correct value may be obtained by accessing it. The correspondence is, for example, the correspondence between a fault bit in a specific position of the block and a non-fault bit in the specific position. In addition, the difference between a fault bit in a specific position of the block and the correct value affects this correspondence.

Figure 5:
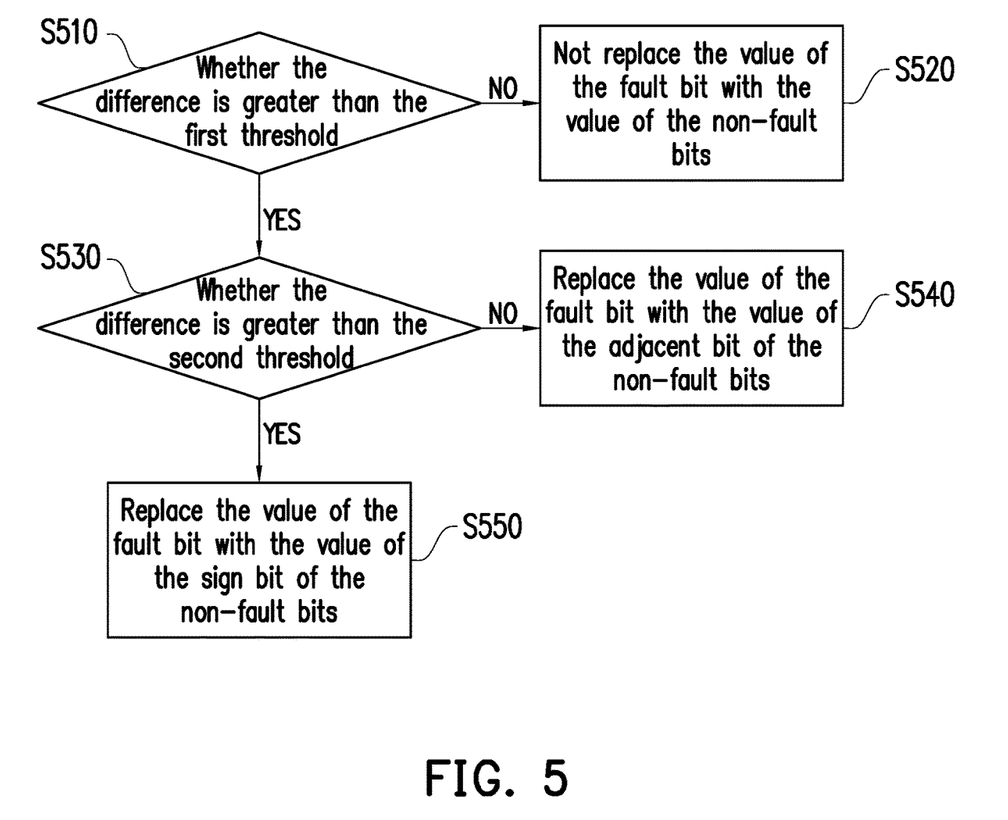
FIG. 5 is a flowchart of a repair condition decision according to an embodiment of the present disclosure.

There are many variations of repair conditions. FIG. 5 is a flowchart of repair condition decision according to an embodiment of the present disclosure. In an embodiment of FIG. 5, when dealing with the situation in which a fault bit is located in a certain position of the block, whether the difference corresponding to this situation is greater than the first threshold may be determined by the processor 120 (step S510). If the difference is not greater than the first threshold, in the situation where the position of the block corresponding to the difference is the fault bit, the repair condition may be set by the processor 120 to disabling or not replacing the fault bit with the value of the non-fault bit (step S520). In other words, the fault bit is not repaired, and the value of the fault bit is directly read as the input of the computing layer. This threshold is related to the level of error tolerance. Since the image recognition accepts a certain level of error, the value of the fault bit in the memory 50 may not be repaired at the acceptable level of error.

It should be noted that the term "replace" in the context refers to the following action: while the parameters of the computing layer may or may not be stored in the fault bit, the processor 120 ignores the read value of the fault bit and directly adopts the value of the non-fault bit as the value of the fault bit. However, the value stored in the fault bit is not stored in the non-fault bit. For example, if the fault bit is the second position, the processor 120 adopts the value at the third position in the sequential data to replace the value at the second position, and does not read the value at the second position. At this time, the value of the second position in the sequential data read by the processor 120 is the same as the value of the third position.

In contrast, if the difference is greater than the first threshold, in the situation where the position of the block corresponding to the difference is a fault bit, the repair condition may be set by the processor 120 to replacing the fault bit with the value of the one or more non-fault bits. The non-fault bit may be the bit adjacent to the fault bit in the same block, the sign bit for storing the symbol or the highest bit in the same block, the bit in different channels but in the same or different ordering position, or any non-fault bit in the memory 50. This non-fault bit has stored data (for example, input parameters or output parameters) used in the computing layer of the neural network. The processor 120 may copy or access the value of the non-fault bit and directly adopt it as the value of the fault bit.

In an embodiment, the processor 120 is further provided with a second threshold. The second threshold is higher than the first threshold. In other words, the second threshold corresponds to a higher level of error. In the situation where the fault bit is located in a certain position of the block and the corresponding difference is greater than the first threshold, whether the difference corresponding to this situation is greater than the second threshold may be further determined by the processor 120 (step S530). If the difference is not greater than the second threshold, in the situation where the fault bit is at this position of the block, the repair condition may be set by the processor 120 to replacing the value of the fault bit with the value of the adjacent bit of the non-fault bit (step S540). For example, the processor 120 copies or repeatedly accesses the value of a higher or lower bit adjacent to the fault bit in the same block. In contrast, if the difference is greater than the second threshold, in the situation where the fault bit is in this position of the block, the repair condition may be set by the processor 120 to replacing it with the value of the sign bit of the non-fault bits (step S550). For example, the processor 120 copies or repeatedly accesses the value of the higher bit in the same block and adopt it as the value of the fault bit.

In one embodiment, when dealing with the situation in which the fault bit is the sign bit or the highest bit in the block, the repair condition may be set by the processor 120 to adopting the value of the adjacent bit in the non-fault bit to replace the sign bit in the block as the fault bit. In other words, regardless of the difference, if the fault bit is the highest bit or the sign bit in the block, the processor 120 directly replaces the value of the fault bit with the value of the bit adjacent to the fault bit.

In FIG. 2, the value of the fault bit may be replaced by the processor 120 with the value of the non-fault bit in the memory 50 based on the repair condition (step S250). Specifically, the repair condition in step S230 has been set to replacing the value of the fault bit with the value of the non-fault bit at the specific location when the fault bit is at the specific location. In one embodiment, if the memory 50 is adapted to store neural network-related parameters, the processor 120 generates repair principles/commands/configurations based on the repair conditions for other neural network-related circuits (assuming that this circuit store parameters in the memory 50). In another embodiment, the data processing circuit 100 performs neural network-related operations on its own. The processor 120 is adapted to allocate neural network-related parameters, and it is based on the repair conditions that it allocates the parameters input to the circuit of the multiply accumulator or other computing layers/operators.

Figure 6:
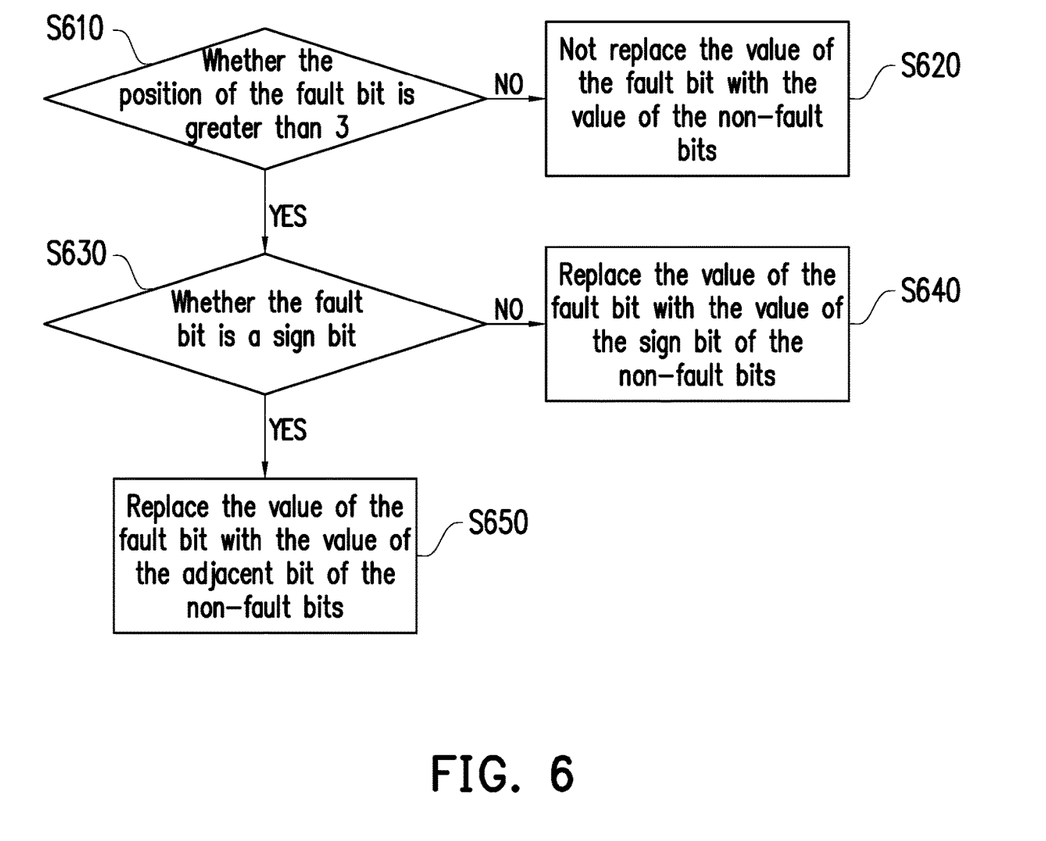
FIG. 6 is a flowchart of a repair condition decision according to an embodiment of the present disclosure.

The following examples illustrate the repair strategy. FIG. 6 is a flowchart of a repair condition decision according to an embodiment of the present disclosure. In FIG. 6, it is assumed that the data processing circuit 100 performs neural network-related operations on its own and stores the related parameters of the operations through the memory 50 having fault bits. The processor 120 determines whether the position (or termed ranking) of the fault bit in the block for storing parameters in the memory 50 is greater than 3 (here, 3 is taken only as an example, and the user can change it based on the difference between the simulated value and the correct value) (step S610).

If the location of the fault bit is not greater than 3 (that is, its location ranking is less than or equal to 3, the one with the higher ranking corresponds to a higher bit, and the one with the lower ranking corresponds to a lower bit), the processor 120 does not replace the value of the fault bit with the value of the non-fault bit (step S620). For example, the processor 120 directly reads the value of the fault bit as a parameter adopted by the neural network or replaces the value of the fault bit with a random value. Alternatively, the processor 120 may also replaces the value of the fault bit with the value of the adjacent bit in the non-fault bit.

If the position of the fault bit is greater than 3, it is further determined by the processor 120 whether the fault bit is a sign bit (step S630). In other words, the processor 13 determines whether the fault bit is the highest bit in the block. If the fault bit is not the sign bit in this block, the value of the fault bit is replaced by the processor 120 with the value of the sign bit of the non-fault bit (step S640). If the fault bit is the sign bit in this block, the value of the fault bit is replaced by the processor 120 with the value of the adjacent bit (for example, the second highest bit) in the non-fault bit (step S650).

Figure 7:
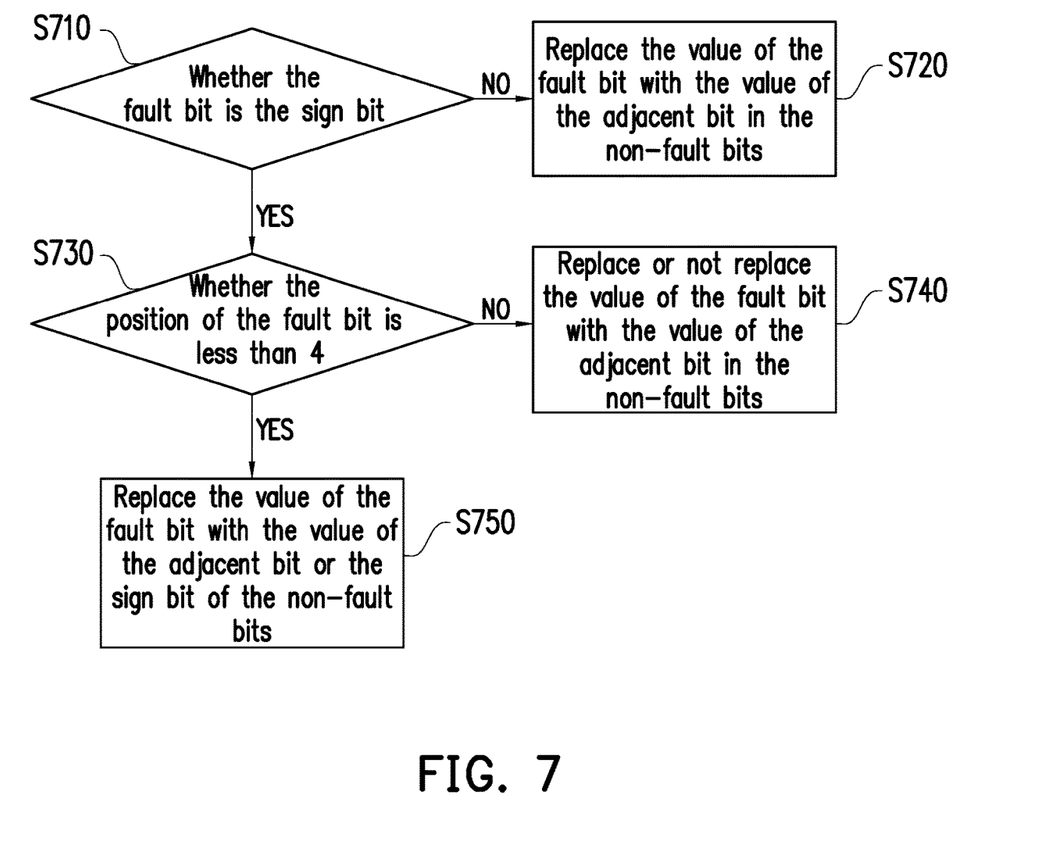
FIG. 7 is a flowchart of a repair condition decision according to an embodiment of the present disclosure.

FIG. 7 is a flowchart of a repair condition decision according to an embodiment of the present disclosure. In FIG. 7, it is assumed that the data processing circuit 100 performs neural network-related operations on its own and stores the related parameters of the operations in the memory 50 having the fault bits. Whether the fault bit in the block for storing parameters in the memory 50 is the sign bit/the highest bit is determined by the processor 120 (step S710). If the fault bit is the sign bit in this block, the processor 120 replaces the value of the fault bit with the value of the adjacent bit (for example, the second highest bit) in the non-fault bit (step S720).

If the fault bit is not the sign bit in this block, the processor 120 further determines whether the position (or ranking) of the fault bit in the block is less than 4 (here, 4 is taken only as an example, and it can change based on the difference from the correct value) (step S730). If the position of the fault bit is less than 4, the processor 120 replaces the value of the fault bit with the value of the adjacent bit in the non-fault bit, or does not replace the value of the fault bit (step S740). If the position of the fault bit is not less than 4, the processor 120 replaces the value of the fault bit with the value of the adjacent bit or the sign bit of the non-fault bit (step S750).

In another embodiment of the repair strategy, it is assumed that the data processing circuit 100 performs neural network-related operations on its own and stores the operation-related parameters in the memory 50 having the fault bits. The processor 120 determines whether the position (or sequence) of the fault bit in the block for storing parameters in the memory 50 is greater than 4 (here, 4 is taken only as an example, and it can change based on the difference from the correct value). If the position of the fault bit is greater than 4 (i.e., its position ranking is greater than 4, where the higher ranking corresponds to the higher bit, and the lower ranking corresponds to the lower bit), the processor 120 swaps the stored and read values. If the position of the fault bit is less than 2 (that is, its position ranking is less than 2), the processor 120 does not replace the value of the fault bit with the value of the non-fault bit. If the position of the fault bit is between 4 and 2 (that is, the positional ranking is between 2 and 4), the processor 120 replaces the value of the fault bit with the value of the sign bit of the non-fault bit.

Figure 8A:
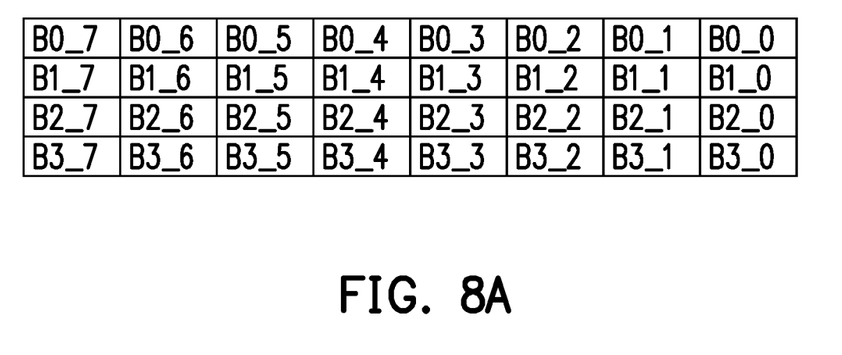
FIG. 8A is an example illustrating the correct data stored in a normal memory.
Figure 8B:
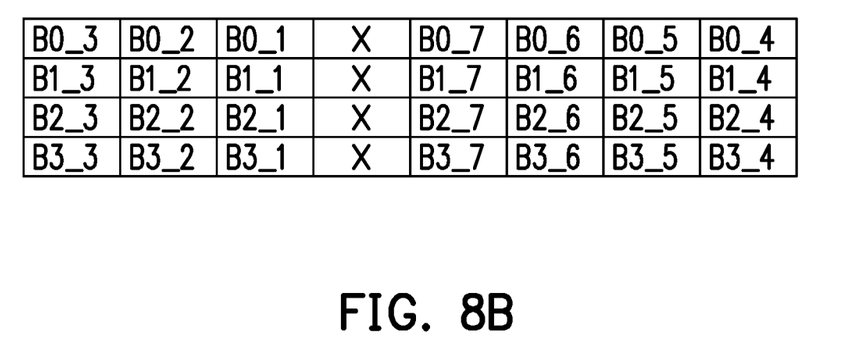
FIG. 8B is an example illustrating the data stored in a faulty memory.

Regarding the reading and storage swap, in one embodiment, the processor 120 divides the block into a first byte and a second byte. One or more fault bits are in the first byte, and the position of the first byte is higher than that of the second byte. FIG. 8A is an example illustrating the correct data stored in a normal memory. For example, in FIG. 8A, it is assumed that the normal memory does not contain any fault bit. The normal memory records four sequential data (including the values B0_0 to B0_7, B1_0 to B1_7, B2_0 to B2_7, and B3_0 to B3_7). The original sequence here refers to the values ranked from the lowest bit to the highest bit, such as B0_0, B0_1, B0_2, . . . , B0_7, and so on. FIG. 8B is an example illustrating the data stored in the faulty memory. In FIG. 8B, it is assumed that the fault bit (indicated by "X") in the fault memory is the fourth bit. The first byte includes the fourth bit to the seventh bit, and the second byte includes the zeroth bit to the third bit.

The processor 120 may store the high byte of the input data in the second byte, and store the low byte of the input data in the first byte. In other words, the high byte of the input data is stored in the lower byte of the block, and the low byte of the input data is stored in the higher byte of the block, and this is the so-called storage swap. Take FIG. 4A and FIG. 4B as an example. The processor 120 swaps and writes/stores the four sequential data in FIG. 4A into the fault memory. Assuming that the high byte of the input data is the fourth to seventh bit, and the byte of the input data is the zeroth to third bit, the value B0_0 is stored in the fourth bit (which is the fault bit), the value B0_1 is stored in the fifth bit, the value B0_7 is stored in the third bit, the value B0_6 is stored in the second bit, and so on.

To perform neural network-related operations using the values in the blocks, the processor 120 may swap the read values in the blocks of the memory 50 according to the positions of the high byte and low byte in the input data. In other words, the value of the lower byte (that is, the second byte) in the block is restored to the higher byte of the input data, and the value of the higher byte (that is, the first byte) in the block is restored to the higher byte of the input data, and this is the so-called reading swap.

Figure 8C:
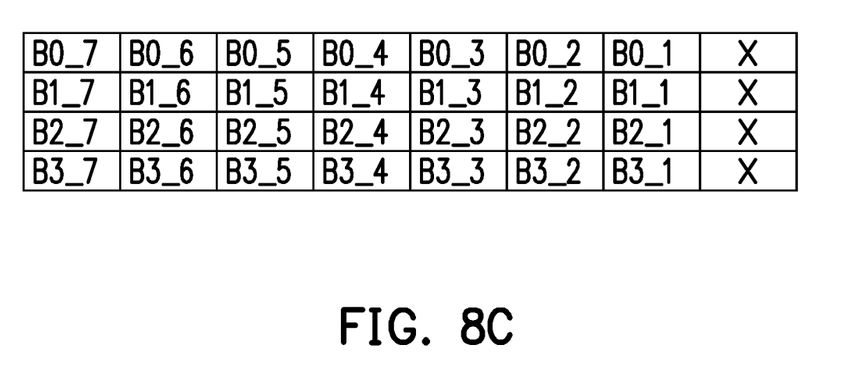
FIG. 8C is an example illustrating data replaced with non-fault bits.

FIG. 8C is an example illustrating data replaced with non-fault bits. For example, in FIG. 8B and FIG. 8C, the value B0_4 to the value B0_7 of the second byte in the block is restored to the high byte, and the value B0_3 to the value B0_1 of the first byte in the block is restored to the low byte. Note that even if the fault bit is located in the fourth bit of the block, the value of the fourth bit in the input data is still correct. Although the read value is still incorrect due to the value stored in the fault bit (such as the zeroth bit shown in FIG. 8C), errors with lower bits have less impact on neural network-related operations, so the distortion caused by fault bits may be tolerated.

In summary, in the data processing circuit and fault mitigating method of the embodiment of the present disclosure, the repair condition is determined based on the difference between the output of the computing layer with fault bits at a specific location and the correct value, and the value of the non-fault bit from a suitable location is provided for the fault bit at a specific location. In this way, the accuracy of the prediction result of the neural network may be improved.

Although the present disclosure has been disclosed in the above embodiments, it is not intended to limit the present disclosure. Anyone with ordinary knowledge in the relevant technical field can make changes and modifications without departing from the spirit and scope of the present disclosure. The protection scope of the present disclosure shall be subject to those defined by the following claims.

What is claimed is:

1. A fault mitigating method adapted for a memory having at least one fault bit, the memory providing a block for data storage, the fault mitigating method comprising:
   determining a difference between an output of at least one computing layer in a neural network and a corresponding correct value of a value of a plurality of bits in the block, wherein the bits are respectively considered the at least one fault bit;
   determining a repair condition of the memory based on the difference, wherein the repair condition comprises a correspondence between a position where the at least one fault bit is located in the block and at least one non-fault bit in the memory; and
   based on the repair condition, replacing a value of the at least one fault bit with a value of the at least one non-fault bit in the memory, wherein determining the repair condition of the memory comprises:
   determining whether the difference is greater than a first threshold;
   in response to the difference being greater than the first threshold, in a situation where a position of the block corresponding to the difference is one of the at least one fault bit, setting the repair condition to replacing the one of the at least one fault bit with the value of the at least one non-fault bit; and
   in response to the difference not greater than the first threshold, in a situation where a position of the block corresponding to the difference is one of the at least one fault bit, setting the repair condition to not replacing the one of the at least one fault bit with the value of the at least one non-fault bit.

2. The fault mitigating method according to claim 1, wherein determining the difference comprises:
   performing simulation in which one of the bits in the block is one of the at least one fault bit; and
   obtaining the output of at least one computing layer by inputting the block having the simulated one of the at least one fault bit to the at least one computing layer.

3. The fault mitigating method according to claim 1, wherein, in a situation where a position of the block corresponding to the difference is one of the at least one fault bit, setting the repair condition to replacing the one of the at least one fault bit with the value of the at least one non-fault bit comprises:
   determining whether the difference is greater than a second threshold, wherein the second threshold is higher than the first threshold;
   in response to the difference being greater than the second threshold, in a situation where a position of the block corresponding to the difference is one of the at least one fault bit, setting the repair condition to replacing the one of the at least one fault bit with a value of a sign bit of the at least one non-fault bit, wherein the sign bit is a highest bit in the block; and
   in response to the difference not greater than the second threshold, in a situation where a position of the block corresponding to the difference is one of the at least one fault bit, setting the repair condition to replacing the one of the at least one fault bit with a value of an adjacent bit of the at least one non-fault bit, wherein the adjacent bit is a bit next to the one of the at least one fault bit in the block.

4. The fault mitigating method according to claim 1, further comprising:
   in a situation where a sign bit in the block is one of the at least one fault bit, setting the repair condition to replacing the one of the at least one fault bit with a value of an adjacent bit of the at least one non-fault bit, wherein the sign bit is a highest bit in the block, and the adjacent bit is a bit next to the one of the at least one fault bit in the block.

5. The fault mitigating method according to claim 1, wherein replacing the value of the at least one fault bit with the value of the at least one non-fault bit in the memory based on the repair condition comprises:
   dividing the block into a first byte and a second byte, wherein the at least one fault bit is located in the first byte, and a position of the first byte is higher than a position of the second byte;
   storing a high byte of an input data in the second byte, and storing a low byte of the input data in the first byte; and
   swapping values in the block based on the position of the high byte and the low byte in the input data.

6. A data processing circuit, comprising:
   a first memory, configured to store a program code; and
   a processor, coupled to the first memory, and configured to load and execute the program code to:
   determine a difference between an output of at least one computing layer in a neural network and a corresponding correct value of a value of a plurality of bits in a block, wherein a second memory provides the block for data storage and has at least one fault bit, and the bits are respectively considered the at least one fault bit;
   determine a repair condition of the second memory based on the difference, wherein the repair condition comprises a correspondence between a position where the at least one fault bit is located in the block and at least one non-fault bit in the second memory; and
   based on the repair condition, replacing a value of the at least one fault bit with a value of the at least one non-fault bit in the second memory, wherein the processor is further configured to:
   determine whether the difference is greater than a first threshold;
   in response to the difference being greater than the first threshold, in a situation where a position of the block corresponding to the difference is one of the at least one fault bit, set the repair condition to replacing the one of the at least one fault bit with the value of the at least one non-fault bit; and
   in response to the difference not greater than the first threshold, in a situation where a position of the block corresponding to the difference is one of the at least one fault bit, set the repair condition to not replacing the one of the at least one fault bit with the value of the at least one non-fault bit.

7. The data processing circuit according to claim 6, wherein the processor is further configured to:
   perform simulation in which one of the bits in the block is one of the at least one fault bit; and obtain the output of at least one computing layer by inputting the block having the simulated one of the at least one fault bit to the at least one computing layer.

8. The data processing circuit according to claim 6, wherein the processor is further configured to:
- determine whether the difference is greater than a second threshold, wherein the second threshold is higher than the first threshold;
- in response to the difference being greater than the second threshold, in a situation where a position of the block corresponding to the difference is one of the at least one fault bit, set the repair condition to replacing the one of the at least one fault bit with a value of a sign bit of the at least one non-fault bit, wherein the sign bit is a highest bit in the block; and
- in response to the difference not greater than the second threshold, in a situation where a position of the block corresponding to the difference is one of the at least one fault bit, set the repair condition to replacing the one of the at least one fault bit with a value of an adjacent bit of the at least one non-fault bit, wherein the adjacent bit is a bit next to the one of the at least one fault bit in the block.

9. The data processing circuit according to claim 6, wherein the processor is further configured to:
- in a situation where a sign bit in the block is one of the at least one fault bit, set the repair condition to replacing the one of the at least one fault bit with a value of an adjacent bit of the at least one non-fault bit, wherein the sign bit is a highest bit in the block, and the adjacent bit is a bit next to the one of the at least one fault bit in the block.

10. The data processing circuit according to claim 6, wherein the processor is further configured to:
- divide the block into a first byte and a second byte, wherein the at least one fault bit is located in the first byte, and a position of the first byte is higher than a position of the second byte;
- store a high byte of an input data in the second byte, and store a low byte of the input data in the first byte; and
- swap values in the block based on the position of the high byte and the low byte in the input data.

* * * * *